(12) United States Patent
Pidin (10) Patent No.: US 8,030,710 B2
(45) Date of Patent: Oct. 4, 2011

(54) STRAINED SEMICONDUCTOR DEVICE

(75) Inventor: Sergey Pidin, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 114 days.

(21) Appl. No.: 12/411,602

(22) Filed: Mar. 26, 2009

(65) Prior Publication Data

US 2009/0321840 A1 Dec. 31, 2009

(30) Foreign Application Priority Data

Jun. 26, 2008 (JP) ................... 2008-167620

(51) Int. Cl.
*H01L 27/092* (2006.01)
*H01L 21/8238* (2006.01)

(52) U.S. Cl. ......... 257/369; 257/E27.062; 257/E21.632; 438/199

(58) Field of Classification Search ........... 257/213, 257/288, 368–389, E21.632–E21.643, E27.062–E27.067; 438/142, 197, 199–233, 689, 694, 700, 701, 438/702

See application file for complete search history.

(56) References Cited

U.S. PATENT DOCUMENTS

| | | | |
|---|---|---|---|
| 6,982,465 B2 | 1/2006 | Kumagai et al. | |
| 7,423,330 B2 | 9/2008 | Satoh | |
| 2005/0285137 A1* | 12/2005 | Satoh | 257/178 |
| 2007/0204250 A1* | 8/2007 | Moroz et al. | 716/10 |
| 2008/0054366 A1 | 3/2008 | Pidin | |
| 2008/0237733 A1* | 10/2008 | Chen et al. | 257/374 |

FOREIGN PATENT DOCUMENTS

| | | | |
|---|---|---|---|
| JP | 2006-013322 A | 1/2006 | |
| JP | 2003-086708 A | 3/2006 | |
| JP | 2008-066484 A | 3/2008 | |

* cited by examiner

*Primary Examiner* — Ha Tran T Nguyen
*Assistant Examiner* — Kevin Quinto
(74) *Attorney, Agent, or Firm* — Westerman, Hattori, Daniels & Adrian, LLP

(57) ABSTRACT

A semiconductor device having: a semiconductor substrate; an isolation trench formed in a surface portion of the semiconductor substrate and defining an NMOSFET active region and a PMOSFET active region; a silicon oxide film burying only a lower portion of the isolation trench and defining a recess above the lower portion; an NMOSFET structure formed in the NMOSFET active region and having an insulated gate electrode structure and n-type source/drain regions; a PMOSFET structure formed in the PMOSFET active region and having an insulated gate electrode structure and p-type source/drain regions; a tensile stress film covering the NMOSFET structure and extending to the recess surrounding the NMOSFET active region and to the recess outside the PMOSFET active region along a gate width direction; and a compressive stress film covering the PMOSFET structure and extending to the recess outside the PMOSFET active region along a channel length direction.

11 Claims, 6 Drawing Sheets

STRAINED SEMICONDUCTOR DEVICE

CROSS-REFERENCE TO RELATED APPLICATION

This application is based upon and claims the benefit of priority of the prior Japanese Patent Application No. 2008-167620, filed on Jun. 26, 2008, the entire contents of which are incorporated herein by reference.

FIELD

The embodiments discussed herein are related to a semiconductor device and its manufacture method, and more particularly to a semiconductor device having an insulating stress-applying film disposed on a semiconductor substrate and its manufacture method.

BACKGROUND

A MOSFET as a constituent element of a semiconductor integrated circuit device has been made finer or smaller in accordance with the scaling law of MOSFET. Finer or smaller MOSFET has an improved operation speed. With scaling-down of MOSFET, integration density of MOSFETs can be increased. It is also known that mobility of charge carriers in semiconductor is influenced by stress.

JP-A-2003-86708 reports that in MOSFETs having a channel direction <110> and formed on the surface of a (001) Si plane, a drain current of an NMOS transistor increased with an increase of tensile stress in the channel direction and in the direction perpendicular thereto, whereas a drain current of a PMOS transistor increased with an increase of tensile stress in the direction perpendicular to the channel increased, and reduced with an increase of tensile stress in a direction parallel to the channel. The effect of stress in the channel length direction is larger than the effect of stress in the direction perpendicular to the channel.

JP-A-2006-13322 describes a relation between a drain current and a stress in gate length (channel length), gate width (channel width) and depth directions in an NMOSFET and in a PMOSMET. Driving ability of NMOSFET is improved by a tensile stress in the gate length direction and gate width direction. Driving ability of PMOSFET is improved by a compressive stress in the gate length direction and by a tensile stress in the gate width direction. In the channel length direction, a tensile stress improves the driving ability of NMOSFET and a compressive stress improves the driving ability of PMOSFET. In the channel width (gate width) direction, a tensile stress improves the driving ability of both NMOSFET and PMOSFET.

Isolation between MOSFET's has been realized by a shallow trench isolation (STI) structure. An isolation trench is formed between elements, and an insulating film is buried in the trench. Since a silicon oxide film provides good burying characteristics, silicon oxide is used as burying material. An intrinsic stress of a silicon oxide film is a compressive stress, and the compressive stress becomes high as heat treatment is repeated. Silicon crystal generates compressive strain under the compressive stress of STI.

A compressive stress of STI is a factor for improving the driving ability of PMOSFET in the channel length direction and degrading the driving ability of PMOSFET in the channel width direction and the driving ability of NMOSFET in the channel length direction and in the channel width direction.

Manufacture process for a semiconductor device includes generally a process of forming a MOS transistor structure, covering the MOS transistor structure with an interlayer insulating film, and forming a contact hole through the interlayer insulating film and exposing an electrode region of a MOS transistor. In order to form a contact hole with good controllability, the interlayer insulating film is made of lamination of an etching stopper film and an insulating film formed on the etching stopper film. A silicon nitride film generally providing a tensile stress is used as the etching stopper film. A silicon nitride film providing a compressive stress is also known.

JP-A-2003-86708 proposes to cover an NMOSFET with a film providing a tensile stress and cover a PMOSFET with a film providing a compressive stress. The characteristics of a CMOSFET are improved by applying a tensile stress to a NMOSFET region and a compressive stress to a PMOSFET region.

JP-A-2006-13322 proposes to cover an NMOSFET with a tensile stress film, cover a PMOSFET with a compressive stress film, and release the compressive stress outside the active region in the gate width direction in PMOSFET. By reducing the compressive stress in the gate width direction of PMOSFET, it becomes possible to suppress lowering of a driving ability of PMOSFET.

JP-2008-66484 proposes to cover an NMOSFET with a tensile stress film, cover a PMOSFET with a compressive film, and locate the border between the films nearer to PMOSFET than NMOSFET. By setting the border nearer to PMOSFET, a driving ability is improved.

Together with the miniaturization of transistors, the size (length, width) of the transistor becomes small. The smaller and narrower the length and width of a transistor are, the larger a compressive strain in the channel length and width directions of the channel region applied from the compressive stress of STI is. As miniaturization advances, lowering of the driving ability of transistors becomes an important issue.

In the technology era of 65 nm rules and succeeding eras, such a structure has been adopted in which an NMOSFET is covered with a tensile stress silicon nitride film and a PMOSFET is covered with a compressive silicon nitride film for performance improvement. Usually, a tensile stress silicon nitride film is deposited on NMOSFET, and the tensile stress silicon nitride film is removed from the PMOSFET region. A compressive stress silicon nitride film is deposited, and the compressive stress silicon nitride film is removed from the NMOSFET region to leave only the tensile stress silicon nitride film in the NMOSFET region.

SUMMARY

According to aspects of an embodiment, there is provided a semiconductor device including:

a semiconductor substrate;

an isolation trench formed in a surface portion of the semiconductor substrate and defining an NMOSFET active region and a PMOSFET active region;

a silicon oxide film burying only a lower portion of the isolation trench and defining a recess above the lower portion;

an NMOSFET structure formed in the NMOSFET active region and having an insulated gate electrode structure and n-type source/drain regions; a PMOSFET structure formed in the PMOSFET active region and having an insulated gate electrode structure and p-type source/drain regions;

a tensile stress film covering the NMOSFET structure and extending to the recess surrounding the NMOSFET active region and to the recess outside the PMOSFET active region along a gate width direction; and a compressive stress film covering the PMOSFET structure and extending to the recess outside the PMOSFET active region along a channel length direction.

The object and advantages of the invention will be realized and attained by means of the elements and combinations particularly pointed out in the claims.

It is to be understood that both the foregoing general description and the following detailed description are exemplarily and explanatory and are not restrictive of the invention, as claimed.

DESCRIPTION OF EMBODIMENTS

With reference to the accompanying drawings, description will now be made on a CMOS (complementary type MOS) semiconductor device.

Figures 1A, 1B:
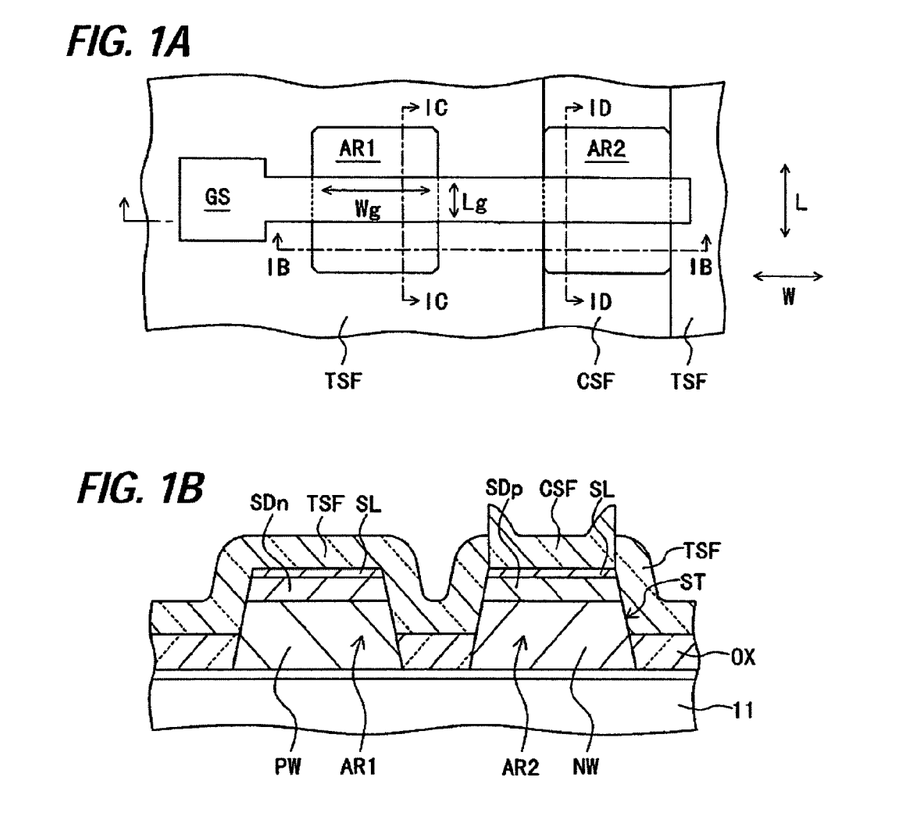
FIGS. 1A to 1D are a plan view and cross sectional views schematically illustrating the structure of a CMOS semiconductor device according to an embodiment.

FIG. 1A is a plan view schematically illustrating a layout of a CMOS (complementary MOS) semiconductor device. As illustrated in FIG. 1A, in order to define active regions AR1 and AR2, a silicon substrate surface layer is selectively etched to form a shallow trench isolation trench, and an insulating film is deposited to form a shallow trench isolation (STI) by embedding or burying the trench with an insulating film. An insulated gate electrode structure GS is formed traversing the active regions AR1 and AR2 in the horizontal direction in the drawing at an intermediate position along a vertical direction.

The vertical direction of the active regions AR1 and AR2 is a gate length direction Lg or length direction L along which carriers move between the source and drain regions, and the horizontal direction is a gate width direction Wg or width direction W for defining a cross sectional area through which carriers move. As will be later described, an NMOSFET structure is formed in the active region AR1, and a PMOSFET structure is formed in the active region AR2.

An isolation region is initially formed by burying an isolation trench formed by etching a silicon substrate with a silicon oxide film having good burying performance. After NMOSFET and PMOSFET structures are formed, the buried silicon oxide film is etched back from the surface thereof to form a recess and leave the silicon oxide film in the lower region. By removing the silicon oxide film in the upper portion of the isolation region, a compressive stress applied by the silicon oxide film can be reduced. Since the recess left on the silicon oxide film is shallow, following film forming conditions are mitigated. In this state, the recess defines active regions.

A silicon nitride film functioning as a tensile stress film TSF is formed covering the NMOSFET structure and extending to a surrounding recess. Since the silicon nitride film having a high tensile stress is formed replacing the upper portion of the silicon oxide film of the isolation region having a compressive stress, a tensile stress is efficiently applied from the silicon nitride film to the channel region. The tensile stress film TSF applies a tensile stress in the channel length and width directions to the NMOSFET structure so that the mobility of electrons in the channel region is improved.

The tensile stress film TSF on the PMOSFET structure and on the recess outside the PMOSFET structure along the up/down direction in the drawing, i.e. along the channel length direction, is removed. A silicon nitride film functioning as a compressive stress film CSF is formed covering the exposed PMOSFET structure and extending to the recess outside the PMOSFET structure along the channel length direction. The compressive stress film CSF formed on the tensile stress film TSF is selectively removed. Since the silicon nitride film having a high compressive stress is formed replacing an upper portion of the silicon oxide film, a compressive stress in the channel length direction is efficiently applied from the silicon nitride film to the channel region. The compressive stress film CSF applies a compressive stress in the channel length direction to the PMOSFET structure so that the mobility of holes in the channel region is improved. The tensile stress film TSF is left or buried in the recess outside the PMOSFET structure along the channel width direction. Therefore, the tensile stress in the channel width direction is applied also to the PMOSFET structure and the mobility of holes is improved further.

FIG. 1B is a cross sectional view illustrating an overall structure of the active regions AR1 and AR2 along a channel width (source/drain width) direction and taken along lateral line IB-IB in FIG. 1B. A shallow trench ST as an isolation trench is formed in a surface layer of a silicon substrate 11 as a semiconductor substrate, to define the active regions AR1 and AR2. A p-type well PW is formed in the active region AR1, and an NMOSFET structure including source/drain regions SDn and silicide regions SL is formed. An n-type well NW is formed in the active region AR12, and a PMOSFET structure including source/drain regions SDp and silicide regions SL is formed. The tensile stress film TSF is disposed on the upper and side surfaces of the active region AR1 including the NMOSFET structure. The compressive stress film CSF is formed on the upper surface of the active region AR2 including the PMOSFET structure, and the tensile stress film TSF is left or disposed on the side surface of the active region AR2.

Figure 1C:
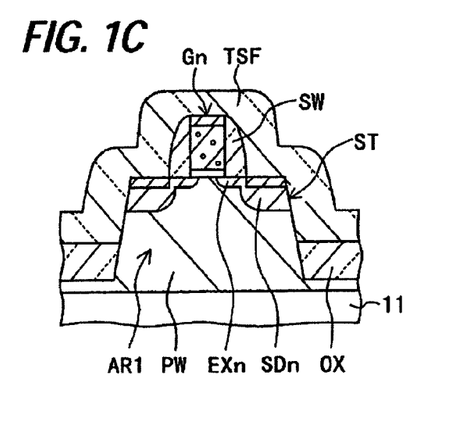
Figure 1D:
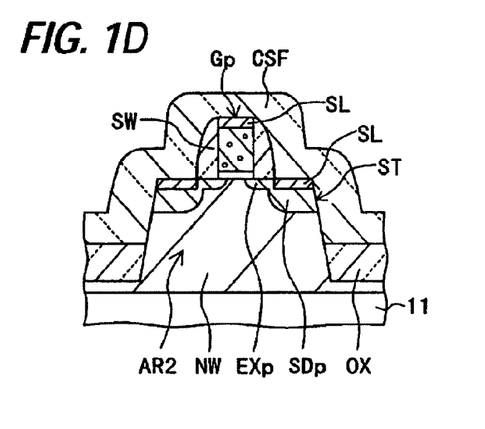

FIG. 1C is a cross sectional view illustrating a schematic structure of the NMOSFET structure along the channel length and taken along line IC-IC in FIG. 1A, and FIG. 1D is a cross sectional view illustrating a schematic structure of the PMOSFET structure along the channel length and taken along line ID-ID in FIG. 1A. An insulated gate electrode Gn formed of lamination of a gate insulating film and a gate electrode is formed on the active region AR1, and n-type source/drain extension regions EXn are formed in the p-type well PW on both sides of the insulated gate electrode. An insulated gate electrode Gp formed of lamination of a gate insulating film and a gate electrode is formed on the active region AR2, and p-type source/drain extension regions EXp are formed in the n-type well NW on both sides of the insulated gate electrode.

Insulating side wall spacers SW are formed on the side walls of the gate electrodes Gn and Gp. A structure including the insulated gate electrode and side wall spacers is called an insulated gate electrode structure. In the p-type well PW outside the insulated gate electrode structure, n-type source/drain regions SDn are formed, and in the n-type well NW outside the insulated gate electrode structure, p-type source/drain regions SDp are formed. A silicide region SL is formed on the surfaces of the source/drain regions SDn and SDp and gate electrodes Gn and Gp. A silicon oxide film OX is disposed in the lower region of the isolation trench ST.

As illustrated in FIGS. 1B and 1C, the tensile stress film TSF is formed covering the NMOSFET structure and extending to the surrounding recess. As illustrated in FIGS. 1B and 1D, the compressive stress film CSF is formed covering the PMOSFET structure and extending to the recess outside the PMOSFET structure along the channel length direction. As shown in FIG. 1B, the tensile stress film TSF is formed in the recess outside the active region AR2 along the channel width direction of the PMOSFET. Description will now be made on a method for manufacturing the CMOS semiconductor device illustrated in FIGS. 1A to 1D.

FIGS. 2A to 2J are schematic cross sectional views of a semiconductor substrate illustrating a method for manufacturing the NMOSFET structure and PMOSFET structure illustrated in FIGS. 1C and 1D.

Figure 2A:
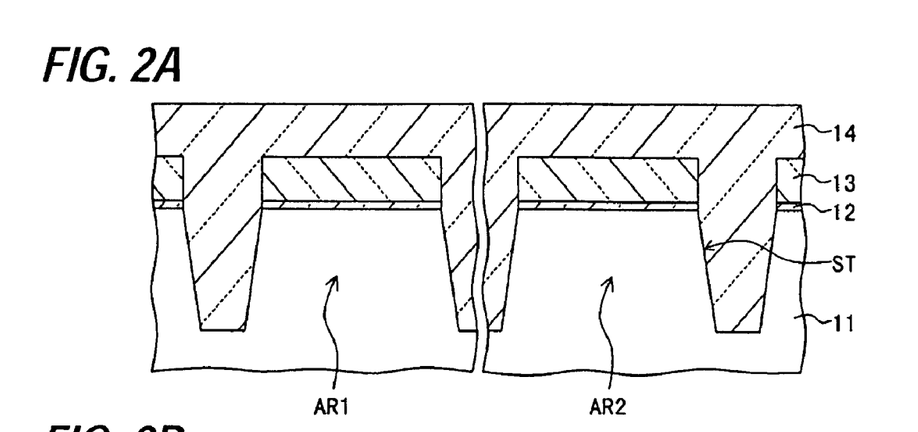
FIGS. 2A to 2J are cross sectional views of a semiconductor substrate schematically illustrating a method for manufacturing the CMOS semiconductor device illustrated in FIGS. 1A to 1D.

As illustrated in FIG. 2A, a silicon oxide film 12 is formed on the surface of a silicon substrate 11 by thermal oxidation, and a silicon nitride film 13 is deposited on the silicon oxide film. The silicon nitride film functions as an etching mask and a stopper in chemical mechanical polishing (CMP). By using a resist pattern, the silicon nitride film 13 and silicon oxide film 12 are patterned to leave the films only on the active regions. By using the patterned silicon nitride film 13 as a mask, the silicon substrate 11 is etched by 200 nm to 400 nm in depth, in this example, by about 350 nm, to form a shallow isolation trench ST surrounding the active regions AR1 and AR2. A plan shape of each of the active regions AR1 and AR2 is a rectangle having, for example, a length of about 2 µm and a width of about 1 µm.

A silicon oxide film having a thickness of about 10 nm is formed by thermally oxidizing the surface of the isolation trench, and a silicon oxide layer 14 is deposited by high density plasma (HDP) chemical vapor deposition (CVD) using tetraethoxysilane (TEOS) as silicon source, to bury the shallow isolation trench ST and form an isolation region. As a width of the shallow isolation trench ST becomes narrow, it becomes necessary to embed the trench with an insulating film having excellent embedding or burying performance. This condition is satisfied by a silicon oxide layer deposited by HDPCVD. An excessive silicon oxide layer 14 is removed by chemical mechanical polishing (CMP) by using the silicon nitride film 13 as a stopper. The exposed silicon nitride film 13 is etched and removed.

Figure 2B:
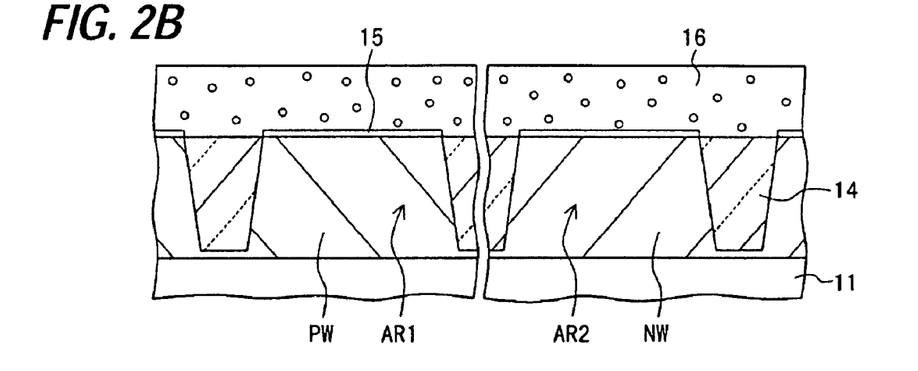

As illustrated in FIG. 2B, selectively exposing the active regions AR1 and AR2 by resist masks, p-type impurity ions are implanted into the active region AR1 to form a p-type well PW, and n-type impurity ions are implanted into the active region AR2 to form an n-type well NW. The oxide film on the surfaces of the active regions AR1 and AR2 are removed, and the cleaned surface is thermally oxidized to form a gate insulating film 15 including a silicon oxide film having a thickness of, e.g. about 1.2 nm to 2.0 nm, on the active region surface. A polysilicon layer 16 having a thickness of 80 nm to 120 nm is deposited on the gate insulating film 15.

Nitrogen may be introduced into the silicon oxide film 15 of the gate insulating film. In addition to the silicon oxynitride film formed by introducing nitrogen into a silicon oxide film, the gate insulating film may be lamination of a silicon oxide film and a silicon nitride film formed on the silicon oxide film or lamination of a silicon oxide film and a high-k film such as $HfO_2$ formed on the silicon oxide film. A cap silicon oxide film having a thickness of, e.g. about 50 nm, may be stacked upon the polysilicon layer 16.

Figure 2C:
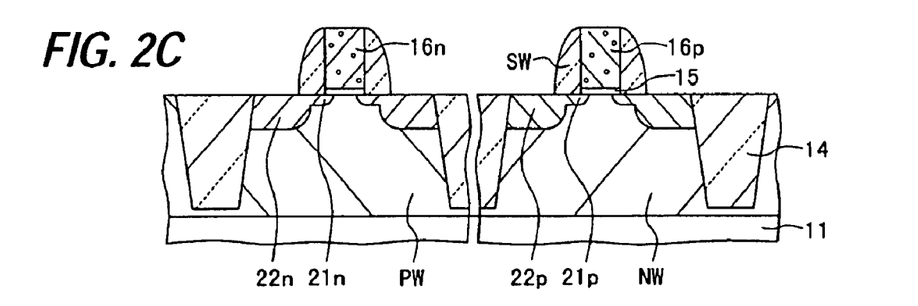

As illustrated in FIG. 2C, by using a resist pattern, the polysilicon layer 16 is patterned to form insulated gate electrodes common to NMOSFET and PMOSFET. A height of the gate electrode is 80 nm to 120 nm. A gate length is 30 nm to 40 nm, in this example 35 nm.

In the p-type well PW, n-type impurity ions are implanted shallowly to form n-type extension regions 21n. For example, As ions are implanted at an acceleration energy of 2 keV and a dose of $5\times10^{14}$. In the p-type well NW, p-type impurity ions are implanted shallowly to form p-type extension regions 21p. For example, B ions are implanted at an acceleration energy of 1 keV and a dose of $4\times10^{14}$. Implanted ions are activated to form extension regions having a depth of about 30 nm. Pocket regions of an opposite conductivity type surrounding the extension regions may be formed by oblique ion implantations of the impurity ions of the opposite conductivity type (same conductivity type as the well).

An insulating film such as a silicon oxide film is deposited conformally on the whole substrate surface, and anisotropical etching is performed to form side wall spacers SW on the side walls of the insulating gate electrodes in the NMOSFET and PMOSFET regions. A width of the side wall spacer SW is, e.g., 70 nm.

In the p-type well PW, n-type impurity ions are implanted deeply to form n-type source/drain diffusion layers 22n. For example, P ions are implanted as n-type impurities at an acceleration energy of 10 keV and a dose of $4\times10^{15}$. In the n-type well NW, p-type impurity ions are implanted deeply to form p-type source/drain diffusion layers 22p. For example, B ions are implanted as p-type impurities at an acceleration energy of 6 keV and a dose of $4\times10^{15}$. Implanted ions are activated to form source/drain diffusion layers having a depth of about 70 to 80 nm. The combination of extension region and source/drain diffusion layer may be collectively called source/drain region, in some cases.

Figure 2D:
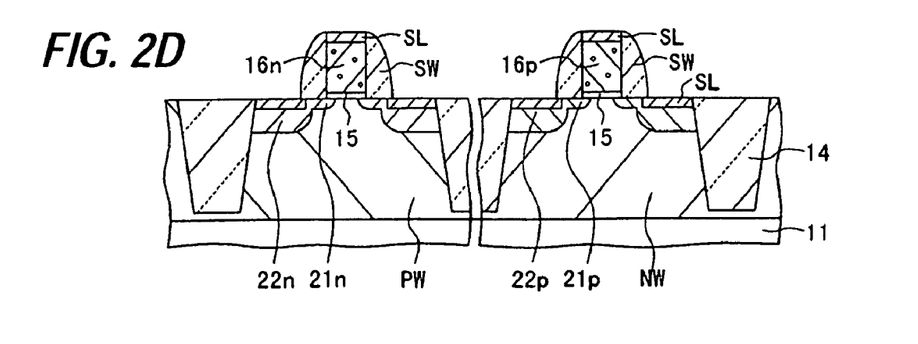

As illustrated in FIG. 2D, a metal layer of nickel etc. is deposited on the silicon substrate, and silicidation reaction is performed to form a silicide region SL on the exposed silicon surface. For example, a nickel silicide layer having a thickness of 20 nm to 25 nm is formed. An unreacted metal layer is removed or washed off thereafter.

Figure 2E:
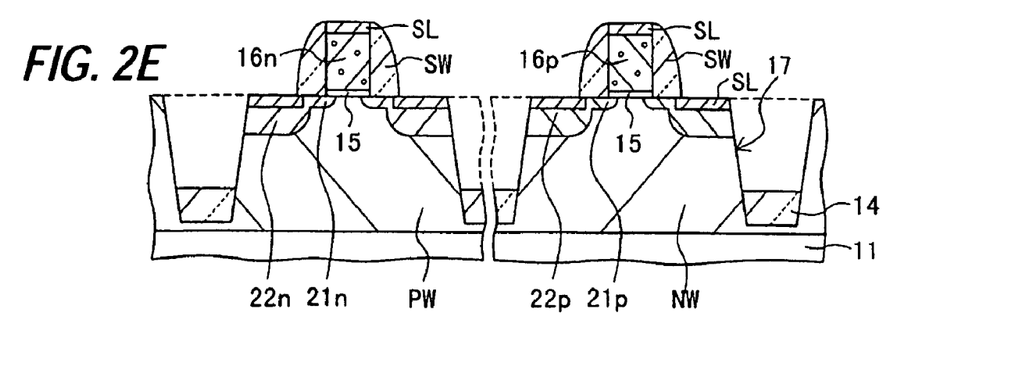

As illustrated in FIG. 2E, after the silicide layer SL is formed, the buried silicon oxide layer 14 is partially etched back by reactive ion etching (RIE) using mixed gas etchant $C_4F_8/Ar/O_2$. A recess 17 having a depth of, e.g. 100 nm to 120 nm, is formed while the silicon oxide layer 14 is left in the lower region of the isolation trench ST. The recess 17 is used for embedding or burying a stress film at later processes. A depth of the recess is preferably set deeper than the source/drain diffusion layers 22 and not deeper than a half of the depth of the isolation trench ST, in order to efficiently apply a stress from the stress film to the channel region and facilitate embedding of burying the stress film.

Figure 2F:
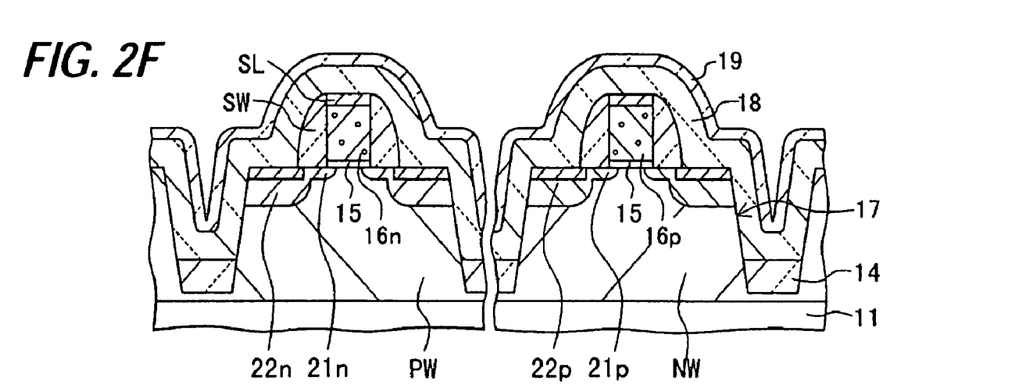

As illustrated in FIG. 2F, a silicon nitride film 18 having a tensile stress and a thickness of 60 nm to 80 nm is deposited on the silicon substrate, and a thin silicon oxide film 19 having a thickness of about 20 nm is deposited on the silicon nitride film. The silicon oxide film 19 functions as an etching stopper at a later process.

The deposition conditions for the tensile stress silicon nitride film 18 are, for example, thermal CVD at a pressure of 0.1 Torr to 400 Torr and a substrate temperature of 400° C. to 450° C. using one of dichlorosilane ($SiCl_2H_2$), silane ($SiH_4$), disilane ($Si_2H_6$), and trisilane ($Si_3H_8$) at a flow rate of 5 sccm to 50 sccm as silicon source, $NH_3$ at a flow rate of 500 sccm to 10000 sccm as N source, and $N_2$ or Ar at a flow rate of 500 sccm to 10000 sccm as carrier gas. A tensile stress is, for example, 1.7 GPa. The deposition conditions for the silicon oxide film 19 are, for example, plasma CVD at a substrate temperature of about 400° C. using mixture gas of SiH$_4$ and O$_2$. The silicon oxide film 19 is sufficient if it can serve as an etching stopper.

The tensile stress silicon nitride film 18 and the silicon oxide film 19 are formed covering the active regions AR1 and AR2 and extending to the recess 17 in the surrounding isolation trench. In order to realize the layout of the tensile stress film and compressive stress film illustrated in FIG. 1A, unnecessary portions of the tensile stress silicon nitride film 18 (and an overlying silicon oxide film 19) are required to be removed.

Figure 2G:
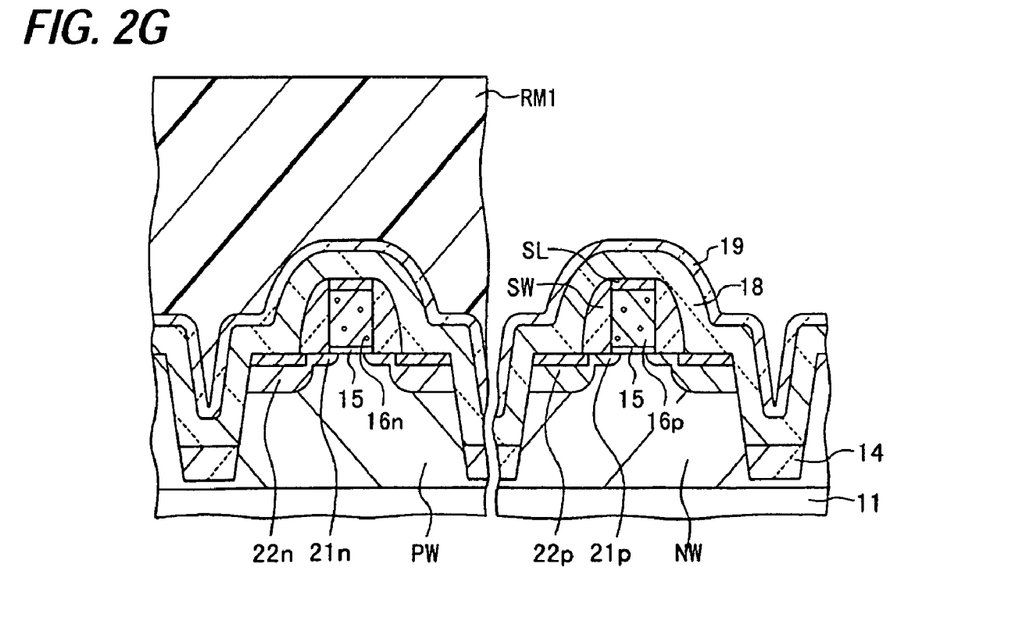

As illustrated in FIG. 2G, a resist mask RM1 is formed by photolithography, which has an opening exposing the PMOSFET active region AR2 and the lamination of the silicon oxide film 19 and the silicon nitride film 18 in the adjacent recess outside the active region along the channel length direction. Although the tensile stress film is patterned to be contiguous with the side edge of the active region AR2 in FIG. 1A, it is sufficient if there is a precision of ±20 nm.

Figure 2H:
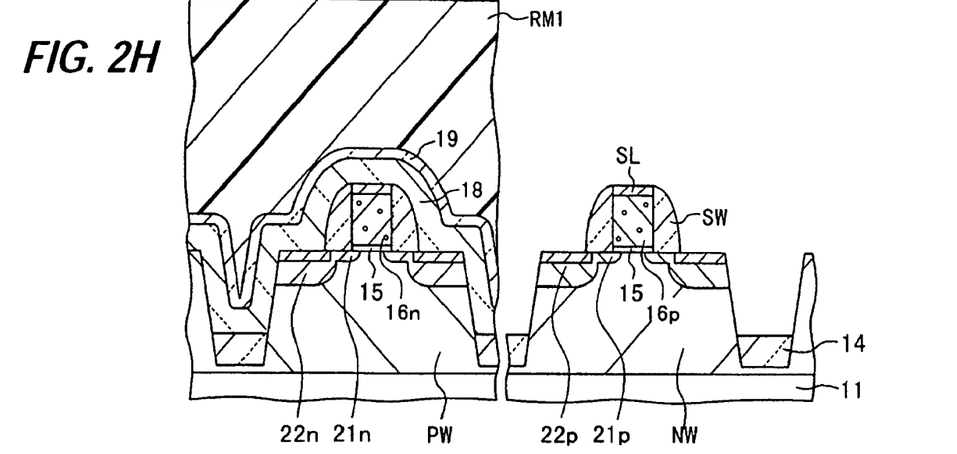

As illustrated in FIG. 2H, the silicon oxide film 19 and silicon nitride film exposed in the opening of the resist mask RM1 are etched. For example, the silicon oxide film 19 is removed by reactive ion etching using etchant gas mixture of C$_4$F$_8$/Ar/O$_2$. The silicon nitride film 18 is removed by reactive ion etching using etchant gas mixture of CHF$_3$/Ar/O$_2$. The resist mask RM1 is thereafter removed.

Figure 2I:
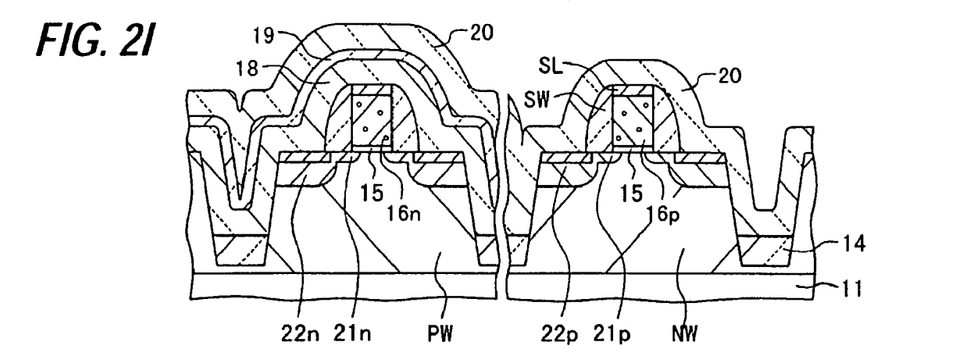

As illustrated in FIG. 2I, a compressive stress silicon nitride film 20 is deposited on the whole silicon substrate surface to a thickness of 60 nm to 80 nm. The deposition conditions for the compressive stress silicon nitride film are, for example, plasma CVD at a pressure of 0.1 Torr to 400 Torr, a substrate temperature of 400° C. to 450° C. and application of high frequency (RF) power of 100 W to 1000 W, using silane (SiH$_4$) as silicon source at a flow rate of 100 sccm to 1000 sccm, NH$_3$ as N source at a flow rate of 500 sccm to 10000 sccm, and N$_2$ or Ar as carrier gas at a flow rate of 500 sccm to 10000 sccm. A compressive stress is, for example, 2.5 GPa.

Figure 2J:
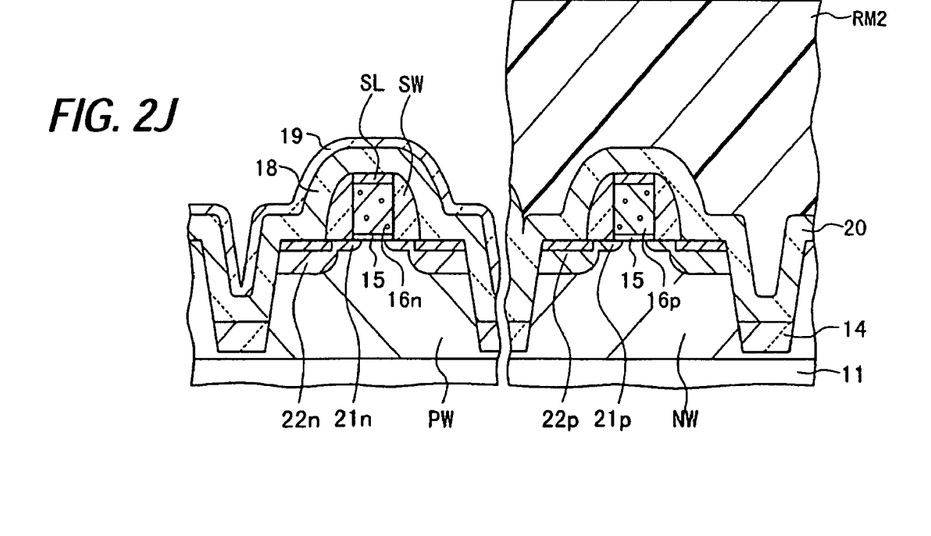

As illustrated in FIG. 2J, a resist mask RM2 is formed by photolithography. The resist mask covers the active region AR2 and the compressive stress silicon nitride film 20 deposited on the adjacent recess outside the active region along the channel length direction. An opening of the resist mask RM2 is shaped to be included or contained within the pattern of tensile stress film 18. By using the resist mask RM2 as an etching mask, the compressive stress silicon nitride film 20 on the silicon oxide film 19 and above the tensile stress silicon nitride film 18 is removed by reactive ion etching using mixed gas etchant of CHF$_3$/Ar/O$_2$. The silicon oxide film 19 functions as an etching stopper. The tensile stress film 18 and compressive stress film 20 contact each other and are partially superposed. The resist mask RM2 is removed thereafter.

In the above description, although the tensile stress film and the compressive stress film are formed by silicon nitride film having a thickness of 60 to 80 nm, a thickness of the silicon nitride stress film may be selected from a range of 40 nm to 100 nm. Also in the above description, although a tensile stress silicon nitride film is first formed and selectively removed and thereafter a compressive stress silicon nitride film is formed, the order of the stress film formation may be reversed, in which case the compressive stress film is first formed and selectively removed.

Thereafter, interlayer insulating films and multilayer wirings are formed by using well-known techniques. For the well-known techniques of a semiconductor device, reference may be made to embodiments of U.S. Pat. No. 6,949,830 and U.S. Pat. No. 7,208,812, the entire contents of which are incorporated herein by reference.

Examples of CMOS semiconductor devices according to the embodiment described above were manufactured and on- and off-currents of PMOSFET's were measured. Comparative examples of conventional techniques were manufactured by without etching back an upper portion of the silicon oxide film of the isolation region, forming the compressive stress silicon nitride film covering PMOSFET and the isolation region around PMOSFET, and on- and off-current were measured.

Figure 3:
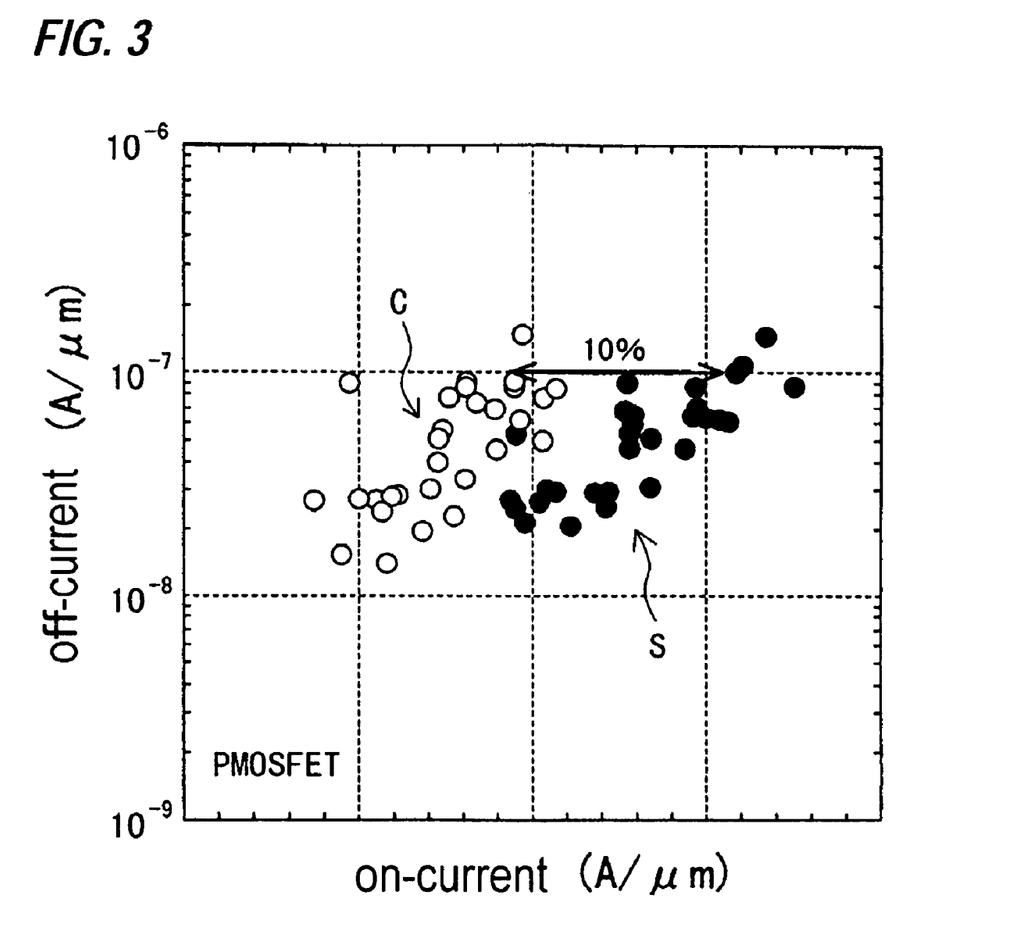
FIG. 3 is a graph illustrating a relation between an on-current and an off-current of PMOSFET's of the embodiment and a comparative example.

FIG. 3 illustrates a graph of measurement results. The abscissa represents an on-current in the unit of A/µm, and the ordinate represents an off-current in the unit of A/µm. Measurement values of PMOSFET comparative examples are indicated by white circles, and measurement values of PMOSFET examples according to the embodiment are indicated by black circles. Comparison at the same off-current indicates that an on-current of PMOSFET of the examples according to the embodiment is larger by about 10% than the on-current of PMOSFET of the comparative example. It is considered that these measurement results suggest that a stress application in the examples according to the embodiment becomes efficient and a suitable stress can be applied in the gate width direction.

Figure 4:
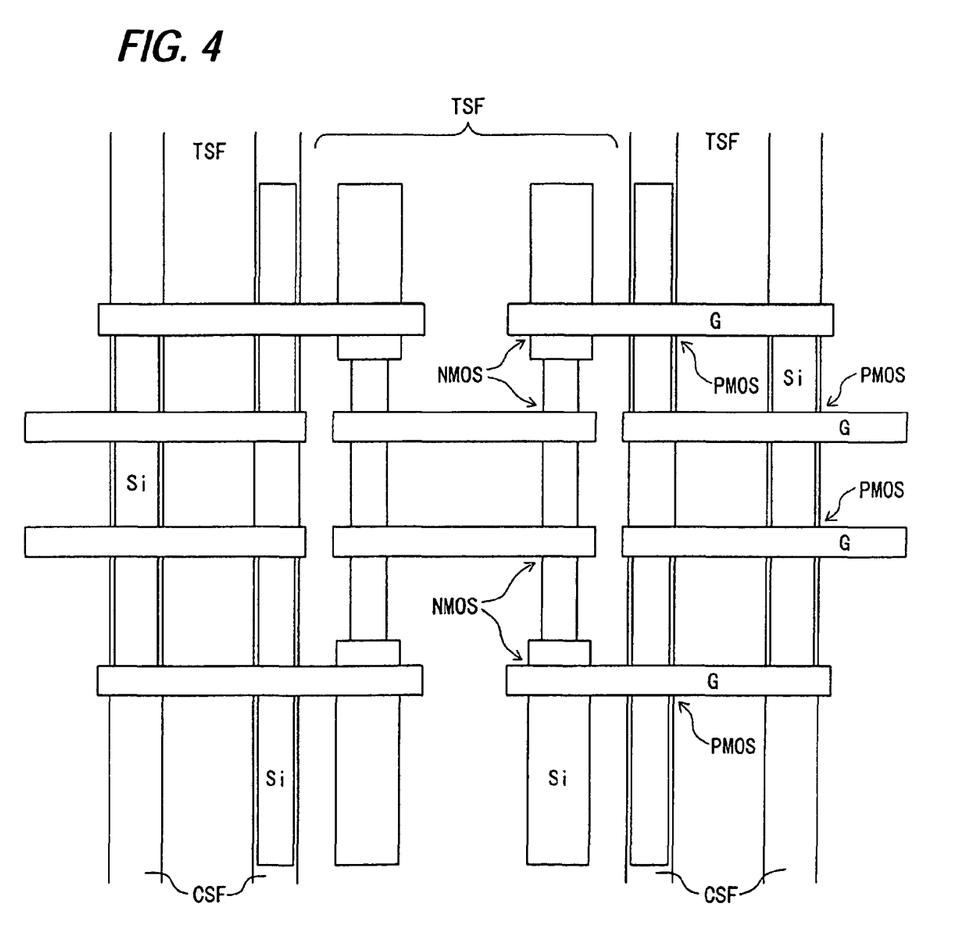
FIG. 4 is a plan view illustrating a layout of an SRAM circuit.

FIG. 4 is a plan view illustrating the layout of an SRAM circuit. Four NMOS transistors are disposed in a vertical direction on the right hand side and covered with a tensile stress nitride film TSF, and two PMOS transistors are disposed in the vertical direction on the right hand side of the four NMOS transistors and covered with a compressive stress nitride film CSF having a width of the channel width. Along the sides of the two PMOS transistors, tensile stress nitride films TSF are disposed. These six MOS transistors constitute one SRAM cell unit. On the left hand side, another SRAM cell of mirror symmetry is disposed. The tensile stress nitride films and compressive stress nitride films are disposed in parallel in a striped shape.

Since an upper portion of the STI silicon oxide film is removed, a compressive stress generated by the STI reduces. A stress film is formed on the recess formed by the removed STI, and generates a suitable stress. Since the silicon oxide film is left in a lower portion of the isolation trench, later stress film burying process can be executed easily.

The tensile stress insulating film covering NMOSFET extends to the recess surrounding the NMOSFET active region and to the recess outside the PMOSFET active region along the channel width direction. It is therefore possible to apply a tensile stress along a channel width direction of PMOSFET.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiment of the present inventions have been described in detail, it should be understood that the various changes, substitutions, and alterations could be made hereto without departing from the spirit and scope of the invention.

What are claimed are:
1. A semiconductor device comprising:
a semiconductor substrate;

an isolation trench formed in a surface portion of said semiconductor substrate and defining an NMOSFET active region and a PMOSFET active region;

a silicon oxide film burying only a lower portion of said isolation trench and defining a recess above the lower portion;

an NMOSFET structure formed in said NMOSFET active region and having an insulated gate electrode structure and n-type source/drain regions;

a PMOSFET structure formed in said PMOSFET active region and having an insulated gate electrode structure and p-type source/drain regions;

a tensile stress film covering said NMOSFET structure, and extending to said recess surrounding said NMOSFET active region, and to said recess outside said PMOSFET active region, and on a side surface of said PMOSFET active region along a gate width direction; and a compressive stress film covering said PMOSFET structure and extending to said recess outside said PMOSFET active region along a channel length direction.

2. The semiconductor device according to claim 1, wherein said NMOSFET structure and said PMOSFET structure have parallel channel length directions, and said tensile stress film and said compressive stress film are formed in a striped shape along said channel length direction.

3. The semiconductor device according to claim 1, wherein a depth of said recess is deeper than said source/drain regions and is equal to, or shallower than, a half of a depth of said isolation trench.

4. The semiconductor device according to claim 1, wherein said tensile stress film and said compressive stress film contact each other.

5. The semiconductor device according to claim 1, wherein said tensile stress film and said compressive stress film are each a silicon nitride film.

6. A method for manufacturing a semiconductor device comprising:

(a) forming an isolation trench in a surface portion of a semiconductor substrate, said isolation trench defining an NMOSFET active region and a PMOSFET active region;

(b) embedding a silicon oxide film in said isolation trench;

(c) forming an NMOSFET structure having an insulated gate electrode structure and n-type source/drain regions, in said NMOSFET active region, and a PMOSFET structure having an insulated gate electrode structure and p-type source/drain regions, in said PMOSFET active region;

(d) removing an upper portion of said silicon oxide film embedded in said isolation trench to form a recess, while leaving a lower portion of said silicon oxide film;

(e) forming a tensile stress insulating film covering said NMOSFET active region and extending to said recess surrounding said NMOSFET active region, and to said recess outside said PMOSFET active region, and on a side surface of said PMOSFET active region along a gate width direction; and (f) forming a compressive stress insulating film covering said PMOSFET active region and extending to said recess outside said PMOSFET active region along a channel length direction.

7. The method for manufacturing a semiconductor device according to claim 6, wherein:

said step (e) deposits a tensile stress insulating film on said semiconductor substrate and removes said tensile stress insulating film on said PMOSFET active region and said recess outside said PMOSFET active region along a channel length direction; and said step (f) deposits a compressive stress insulating film on said semiconductor substrate and removes said compressive stress insulating film on said NMOSFET active region and said recess surrounding said NMOSFET active region and said recess outside said PMOSFET active region along a channel width direction.

8. The method for manufacturing a semiconductor device according to claim 7, wherein said tensile stress insulating film in said step (e) and said compressive stress insulating film in said step (f) are each a silicon nitride film.

9. The method for manufacturing a semiconductor device according to claim 8, wherein said step (e) forms said tensile stress insulating film by thermal CVD, and said step (f) forms said compressive stress insulating film by plasma CVD.

10. The method for manufacturing a semiconductor device according to claim 7, wherein one of said steps (e) and (f) to be executed first deposits a silicon oxide cover film on said silicon nitride film and etches said silicon oxide cover film in a same pattern as said silicon nitride film, and other of said steps (e) and (f) to be executed later uses said silicon oxide cover film as an etching stopper.

11. A method for manufacturing a semiconductor device comprising:

(a) forming an isolation trench in a surface portion of a semiconductor substrate, said isolation trench defining an NMOSFET active region and a PMOSFET active region;

(b) embedding a silicon oxide film in said isolation trench;

(c) forming an NMOSFET structure having an insulated gate electrode structure and n-type source/drain regions, in said NMOSFET active region, and a PMOSFET structure having an insulated gate electrode structure and p-type source/drain regions, in said PMOSFET active region;

(d) removing an upper portion of said silicon oxide film embedded in said isolation trench to form a recess, while leaving a lower portion of said silicon oxide film;

(e) forming a tensile stress insulating film covering said NMOSFET active region and extending to said recess surrounding said NMOSFET active region and to said recess outside said PMOSFET active region along a gate width direction; and (f) forming a compressive stress insulating film covering said PMOSFET active region and extending to said recess outside said PMOSFET active region along a channel length direction, wherein:

said step (e) deposits a tensile stress insulating film on said semiconductor substrate and removes said tensile stress insulating film on said PMOSFET active region and said recess outside said PMOSFET active region along a channel length direction;

said step (f) deposits a compressive stress insulating film on said semiconductor substrate and removes said compressive stress insulating film on said NMOSFET active region and said recess surrounding said NMOSFET active region and said recess outside said PMOSFET active region along a channel width direction; and one of said steps (e) and (f) to be executed first deposits a silicon oxide cover film on said silicon nitride film and etches said silicon oxide cover film in a same pattern as said silicon nitride film, and other of said steps (e) and (f) to be executed later uses said silicon oxide cover film as an etching stopper.

* * * * *